(12) United States Patent
Liao

(10) Patent No.: US 6,876,024 B2
(45) Date of Patent: Apr. 5, 2005

(54) METHOD AND LAYOUT FOR MOS CAPACITORS WITH PHASE SHIFTED LAYERS

(75) Inventor: Hongmei Liao, Littleton, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 161 days.

(21) Appl. No.: 10/210,705

(22) Filed: Jul. 31, 2002

(65) Prior Publication Data

US 2004/0022006 A1 Feb. 5, 2004

(51) Int. Cl.[7] .......................... H01L 27/08; H01L 29/00
(52) U.S. Cl. ........................ 257/296; 257/532; 257/534
(58) Field of Search ................................. 257/296, 300, 257/532, 534, 206

(56) References Cited

U.S. PATENT DOCUMENTS 6,396,086 B1 * 5/2002 Takeuchi et al. ............ 257/206

* cited by examiner

Primary Examiner—Steven Loke
(74) Attorney, Agent, or Firm—Lahive & Cockfield, LLP

(57) ABSTRACT

A layout and a method for generating a mask for a capacitor are provided. The layout and the mask allow for the formation of the capacitor or an array of capacitors without phase conflict when using phase shift masks in an optical lithography fabrication process.

16 Claims, 4 Drawing Sheets

METHOD AND LAYOUT FOR MOS CAPACITORS WITH PHASE SHIFTED LAYERS

TECHNICAL FIELD OF THE INVENTION

This invention relates to optical lithography, and more particularly, to phase shifts masks (PSM).

BACKGROUND OF THE INVENTION

Currently, phase shift mask (PSM) techniques are being developed and refined to extend the resolution of optical lithography in fabrication of integrated circuits. Through the use of PSM techniques, optical lithography processes are able to fabricate discrete devices with feature sizes that are below the illumination wavelength of an optical lithography illumination source.

One PSM technique known in the art is alternating phase shift mask (altPSM) lithography. AltPSM lithography is a two exposure lithographic technique. That is, a first lithographic exposure is complimented with a second lithographic exposure into the same undeveloped photo resist to create an incoherent sum of two images that resemble a target image of an integrated circuit layout. AltPSM lithography requires that masks of opposite phase values be placed on either side of a feature to be patterned.

One concern in altPSM lithography is maintaining the placement of phase shifters so that the phase shifters have opposite phase values that are 180° out of phase throughout the layout of the integrated circuit. In a layout having two adjacent phase shifters of the same phase value, a condition known as phase conflict arises. When a phase conflict arises, it is an indication that an alternating mapping of PSMs across each feature to be patterned using altPSM is not present. To resolve a phase conflict condition, the mapping of PSM's across each feature to be patterned must be revised to allow for the required alternating mapping of the PSM's across each feature.

AltPSM is typically used to form the gate of a metal oxide semiconductor (MOS) device. Unfortunately, when the MOS device is a transistor designed for use as a MOS capacitor, such as a decoupling capacitor, phase conflict arises due to the placement of the source region and the drain region in the center region of the polygon cell forming the MOS capacitor. Thus, a significant amount of die area in a layout of an integrated circuit is consumed by MOS capacitors.

SUMMARY OF THE INVENTION

The present invention addresses the above-described limitations associated with forming features of a MOS capacitor using altPSM lithography. The present invention provides an approach to patterning the gate of a MOS capacitor using altPSM lithography that avoids phase conflict. Moreover, the present invention allows for an array of abutting MOS capacitors to be fabricated using altPSM lithography.

In one embodiment of the present invention, a capacitor is provided having a plurality of layers patterned by one or more altPSM lithography exposures. The layers of the capacitor patterned by the exposure of the altPSM lithography results in a first feature pair intersected by a first diagonal plane of the capacitor and a second feature pair intersected by a second diagonal plane of the capacitor. The capacitor also includes a gate region. The gate region of the capacitor covers a central portion of the capacitor and extends from the central portion to a number of edge portions of the polygon shaped capacitor.

The number of the edge portions of the capacitor define in part the first feature pair and the second feature pair. A first feature of the first feature pair and a first feature of the second feature pair together form a drain region of the capacitor. In similar fashion, a second feature of the first feature pair and a second feature of the second feature pair together form a source region of the capacitor.

In another embodiment of the present invention, a method is provided that includes the steps for generating a mask for a capacitor. The steps include providing a capacitor layout having a plurality of features and forming a plurality of phase regions on the mask to define a selected one of said plurality of features. The method further includes the step of forming a plurality of non-phase regions on the mask to selectively remove a plurality of undesired images from the plurality of phase regions. The method upon the forming of the plurality of phase regions and the plurality of non-phase regions generates the mask for the capacitor.

The method also includes the steps of determining which of the plurality of features is a critical feature and forming a phase region of uniform area in each of four quadrants of the capacitor layout to define the critical feature. The plurality of phase regions are substantially different by about 180°.

In yet another embodiment of the present invention, a capacitor array having abutting capacitors is provided. A plurality layers of each capacitor in the array are formed through altPSM lithography. The plurality of layers form a first plurality of features that are shaped to allow formation of a second plurality of features. The second plurality of features are formed at each corner of each capacitor in for the capacitor array. Each of the first plurality of features include a gate region of each capacitor in the array of capacitors. The second plurality of features formed at each corner of each capacitor in the array form source regions and drain regions for each capacitor in the array.

BRIEF DESCRIPTION OF THE DRAWINGS

An illustrative embodiment of the present invention will be described below relative to the following drawings, in which like reference characters refer to the same parts throughout the different views.

DETAILED DESCRIPTION

The illustrative embodiment of the present invention provides a method for generating a mask and a capacitor that includes layers formed by PSM. Specifically, the alternative embodiment provides a capacitor having 0° phase layers and 180° phase layers assigned alternatively around a gate region of the capacitor without giving rise to phase conflict.

In the illustrative embodiment, the capacitor layout is well suited for use in integrated circuits using 0.11 micron, or less, CMOS technology. The capacitor layer is compatible with 0.11 micron CMOS fabrication technology and therefore does not require the development of new or specialized processing steps to fabricate the capacitor. The capacitor of the illustrative embodiment is also well suited for use in the formation of an array of capacitors that avoid phase conflict in PSM lithography. The array of capacitors is particularly useful in the formation of on-chip decoupling capacitors where a large amount of capacitance is needed without having a significant impact to the die area of the integrated circuit.

Figure 1:
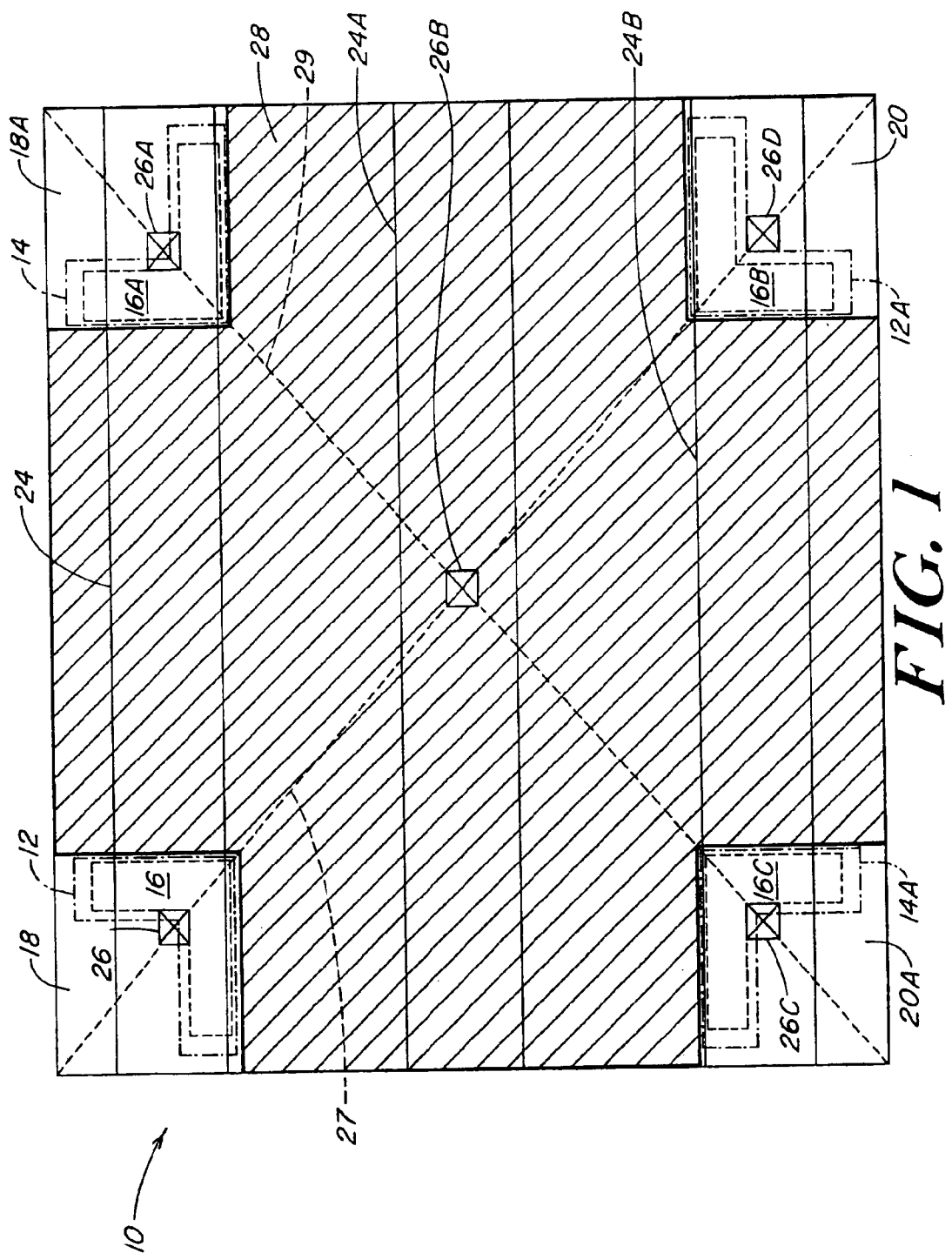
FIG. 1 illustrates a layout of a capacitor suitable for practicing an embodiment of the present invention.

FIG. 1 is an exemplary capacitor layout 10 that is suitable for practicing the illustrative embodiment of the present invention. The exemplary capacitor layout 10 includes a gate region 28 formed of polysilicon and a first region pair having a first region 18 and a second region 20. A first diagonal plane 27 of the exemplary capacitor 10 intersects the first region 18 and the second region 20. The exemplary capacitor 10 includes a second region pair formed by a first region 18A and a second region 20A. A second diagonal plane 29 intersects the first region 18A and the second region 20A of the exemplary capacitor layout 10.

The first feature 18 of the first feature pair includes a 0° phase region 12 and a trim mask region 16. The first feature 18A of the second feature pair includes a 180° phase region 14 and a trim mask region 16A. The second feature pair 20 of the first feature pair includes a 0° phase region 12A and a trim mask region 16B. The second feature 20A of the second feature pair include a 180° phase region 14A and a trim mask region 16C. Each feature described above and below relate to circuit features of a capacitor (e.g., polygates, interconnects and transistor regions) positioned as specified in the exemplary capacitor layout 10. The altPSM regions 12, 14, 12A, and 14A are of uniform width and length and are placed at the corner regions of the exemplary capacitor layout 10 to form the gate region 28 illustrated in FIG. 1. The trim mask regions 16, 16A, 16B, and 16C are often referred to as binary masks. The trim mask regions 16, 16A, 16B, and 16C are placed within the altPSM regions 12, 14, 12A, and 14A to allow patterning or formation of selected features of the exemplary capacitor layout 10 using a double exposure alt PSM technique.

The double exposure alt PSM technique is a multi step patterning technique that uses a number mask to subject at least a portion of a wafer to at least two light sources of the appropriate wavelength. To accomplish the double exposure alt PSM technique the wafer is first coated with a photosensitive polymer or photoresist (resist). In this instance, the resist is considered a positive resist. That is, exposing the resist to light of the appropriate wavelength causes modifications in the molecular structure of the resist polymers, which, in turn, allow the resist in the exposed areas to be dissolved and removed. A negative resist allows unexposed resist to be dissolved and removed. As such, the altPSM regions 12, 14, 12A, and 14A are first exposed using a phase shift mask. The phase shift mask is a dark field mask having a chrome background, but allows the altPSM regions 12, 14, 12A, and 14A to be exposed with light of the appropriate wavelength. The altPSM regions 12, 14, 12A, and 14A provide improved image contrast and lithographic resolution to define the gate region 28.

To expose and pattern the remainder of the gate region 28 the trim mask regions 16, 16A, 16B, and 16C are exposed using a clear field mask. The clear field mask allows the remainder of the first feature pair and the second feature pair to be exposed to light of the appropriate wavelength while preventing the gate region 28 from being exposed. As such, when the resist is developed the gate region 28 is formed.

Those skilled in the art will recognize that the assignment of the alternating phase regions in the layout of the exemplary capacitor layout 10 avoids phase conflict in PSM lithography. Moreover, those skilled will recognize that the phase regions in each of the features 18, 18A, 20, and 20A can have a different phase value that is 180° from the phase value discussed above so long as the alternating phase pattern is sustained in the corner regions of the exemplary capacitor layout 10.

In fabrication of a capacitor from the exemplary capacitor layout 10, the first feature 18 and the second feature 20 of the first feature pair along with the first feature 18A and the second feature 20A of the second feature pair are regions of the exemplary capacitor layout 10 that are exposed to light as a result of the altPSM regions 12, 14, 12A, and 14A. In the same manner the gate region 12 is unexposed to the light as a result of the destructive interference provided by the altPSM regions 12. 14, 12A, and 14A. In addition, the first feature 18 and the second feature 20 of the first feature pair, and with the first feature 18A and the second feature 20A of the second feature are exposed a second time as discussed above to define the relatively large first and second feature pairs.

In FIG. 1, the trim mask regions 16, 16A, 16B, and 16C, have a similar shape as the altPSM regions 12, 14, 12A, and 14A. The trim mask regions 16, 16A, 16B, and 16C generally correlates to an opaque (dark field) mask with openings placed in order to allow light to expose the images left by the shadows projected by the residual phase edges. Together, the altPSM regions 12, 14, 12A, and 14A along with the trim regions 16, 16A, 16B, and 16C allow the formation of the gate region 28 without PSM phase conflict. This, in turn, allows capacitors to realize a smaller die area in an integrated circuit. Moreover, the capacitor formed from the exemplary capacitor layout 10 is able to provide a capacitance value that is suitable for use with 0.11 micron or less CMOS technology.

In the exemplary capacitor layout 10, the first feature 18 of the first feature pair and the first feature 18A of the second feature pair form a source region having a metal layer 24. The first feature 18 of the first feature pair includes a first contact region 26 formed over a portion of a first surface of the metal layer 24 and the first feature 18A of the second feature includes a second contact region 26A formed over a portion of the first surface of the metal layer 24.

The second feature 20 of the first feature pair and the second feature 20A of the second feature pair form a drain region of the exemplary capacitor layout 10. The drain region includes a metal layer 24B having a first contact region 26C formed over a portion of a first surface of the metal layer 24B and a second contact region 26D formed over a portion of the first surface of the metal layer 24B.

The gate region 28 includes a metal layer 24A having a first contact region 26B formed over a portion of a first surface of the metal layer 24A. A capacitor formed in accordance with the exemplary capacitor layout 10 typically has the first contact region 26, the second contact region 26A, the first contact region 26C, and the second contact region 26D coupled to a source or node supplying VSS or ground. In similar fashion, the first contact region 26B of the gate region 28 is coupled to a node or source supplying VDD. In this configuration, the capacitor formed in accordance with the exemplary capacitor layout 10 is suitable for use as a decoupling capacitor in an integrated circuit utilizing 0.11 micron or less CMOS technology.

Moreover, those skilled in the art will recognize that the source regions and drain regions formed by the features 18, 18A, 20 and 20A are interchangeable. That is, feature 18 and 18A are suitable for forming the drain region while feature 20 and 20A are suitable for forming the source region of a capacitor formed in accordance with the exemplary capacitor layout 10.

Figure 2:
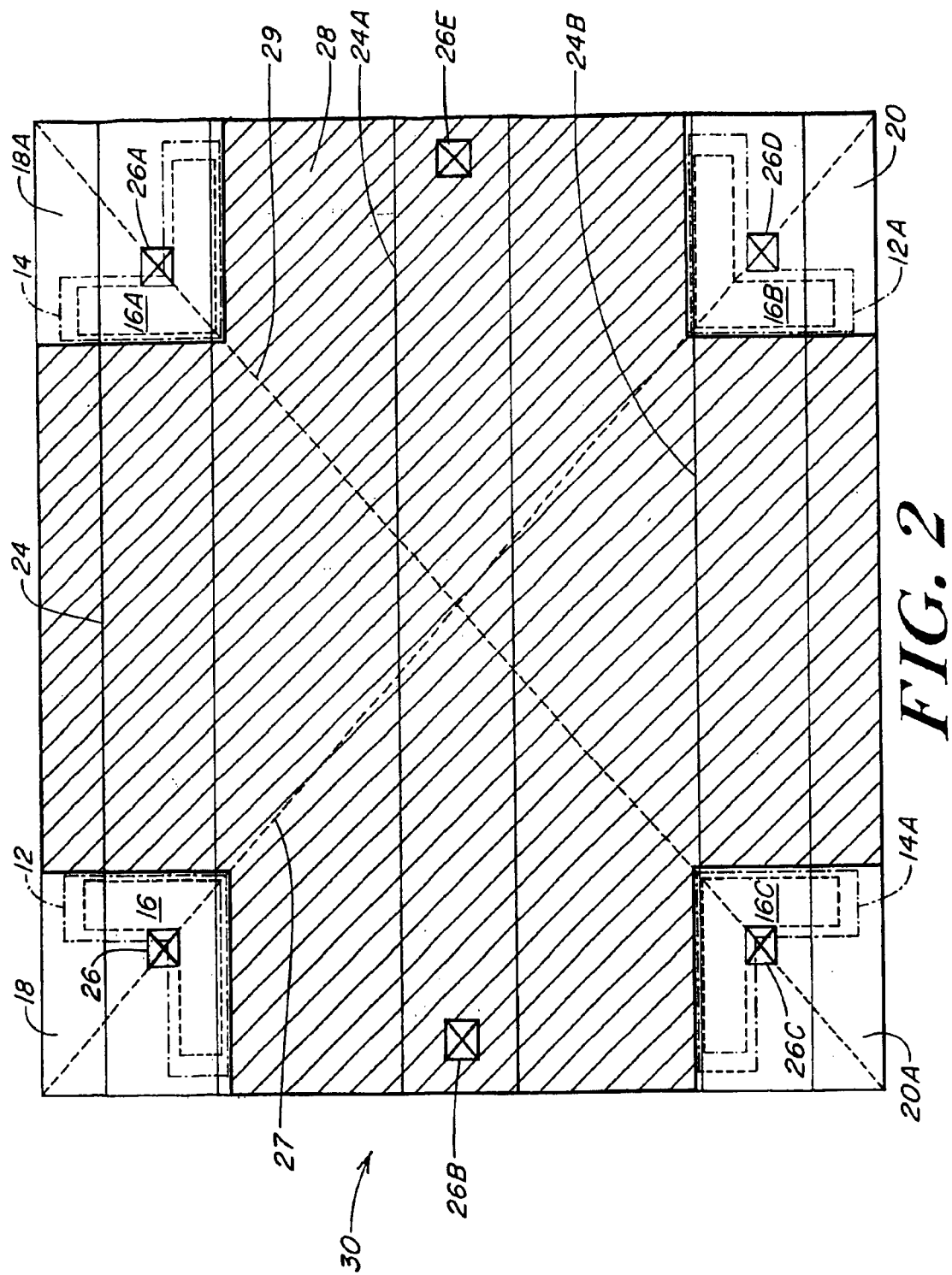
FIG. 2 illustrates an alternate layout of a capacitor suitable for use in an embodiment of the present invention.

FIG. 2 illustrates an exemplary capacitor layout 30 similar to the exemplary capacitor layout 10 illustrated in FIG. 1. The exemplary capacitor layout 30 is formed using the altPSM regions 12, 14, 12A, and 14A along with trim mask regions 16, 16A, 16B, and 16C. The significant difference between the exemplary capacitor layout 30 and the exemplary capacitor layout 10 is the formation of a second contact region 26E on a portion of the first surface of the metal layer 24A. As such, the gate region 28 has a first contact region 26B at a first edge of the exemplary capacitor layout 30 and a second contact region 26E at a second edge of the exemplary capacitor layout 30. The second contact region 26E, like the first contact region 26B is suitable for coupling to VDD.

Figure 3:
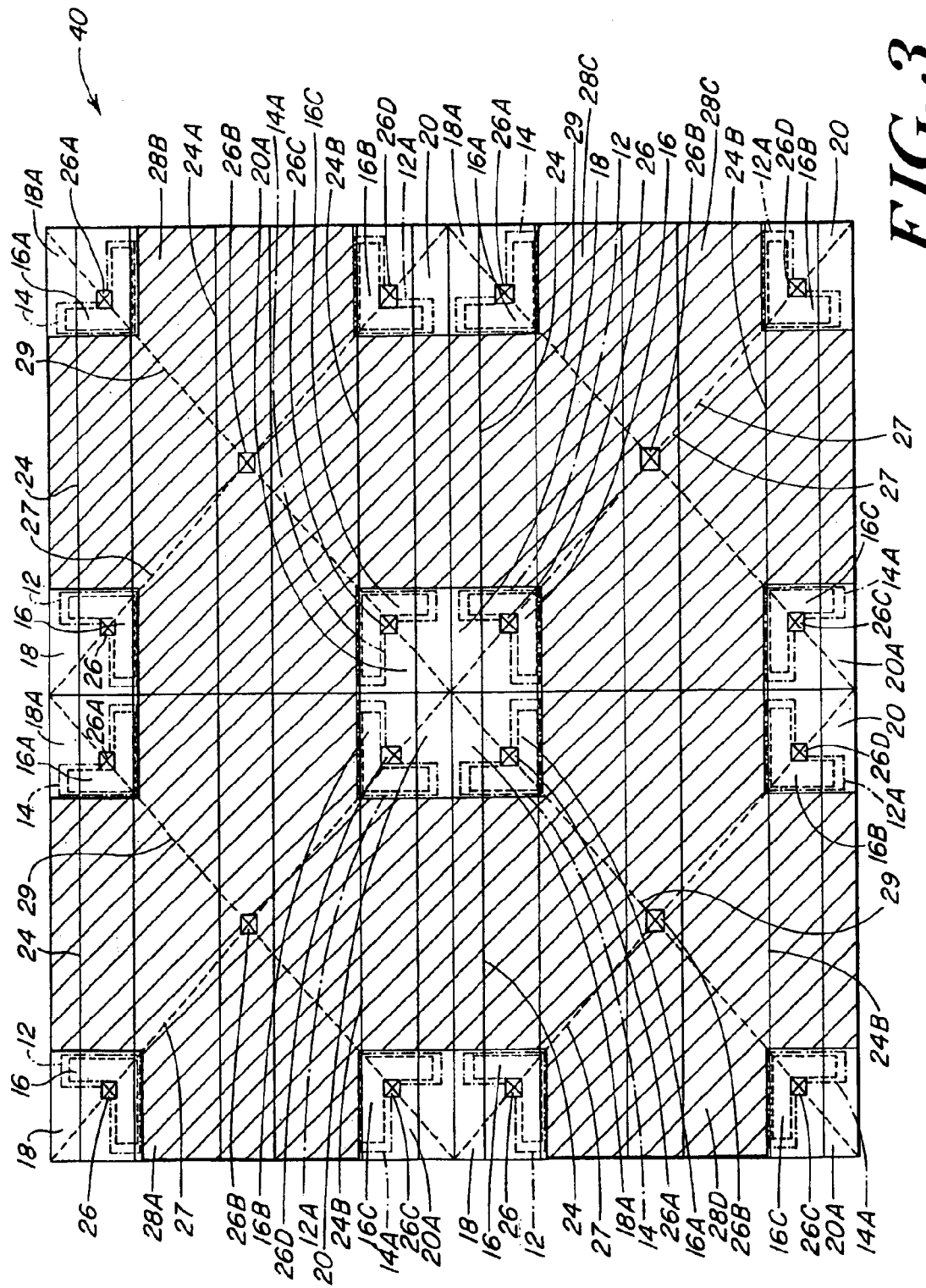
FIG. 3 illustrates a layout of an array of capacitors suitable for use in an embodiment of the present invention.

FIG. 3 illustrates an exemplary capacitor layout 40 suitable for forming an array of capacitors. As illustrated in the exemplary capacitor layout 40, capacitor layouts 28A, 28B, 28C and 28D abut one another without encountering phase conflict during the altPSM lithography process. In this manner, an integrated circuit needing a large capacitance value in a small amount of area can be fabricated using altPSM lithographic techniques. As a consequence, the amount of on-chip decoupling capacitance in an integrated circuit can be increased while maintaining or even decreasing an amount of die area previously utilized for on-chip decoupling capacitors in the integrated circuit. Those skilled in the art will recognize that the exemplary capacitor layout 40 can be expanded upon to include more than four capacitor layouts, for example, six capacitor layouts or more.

Figure 4:
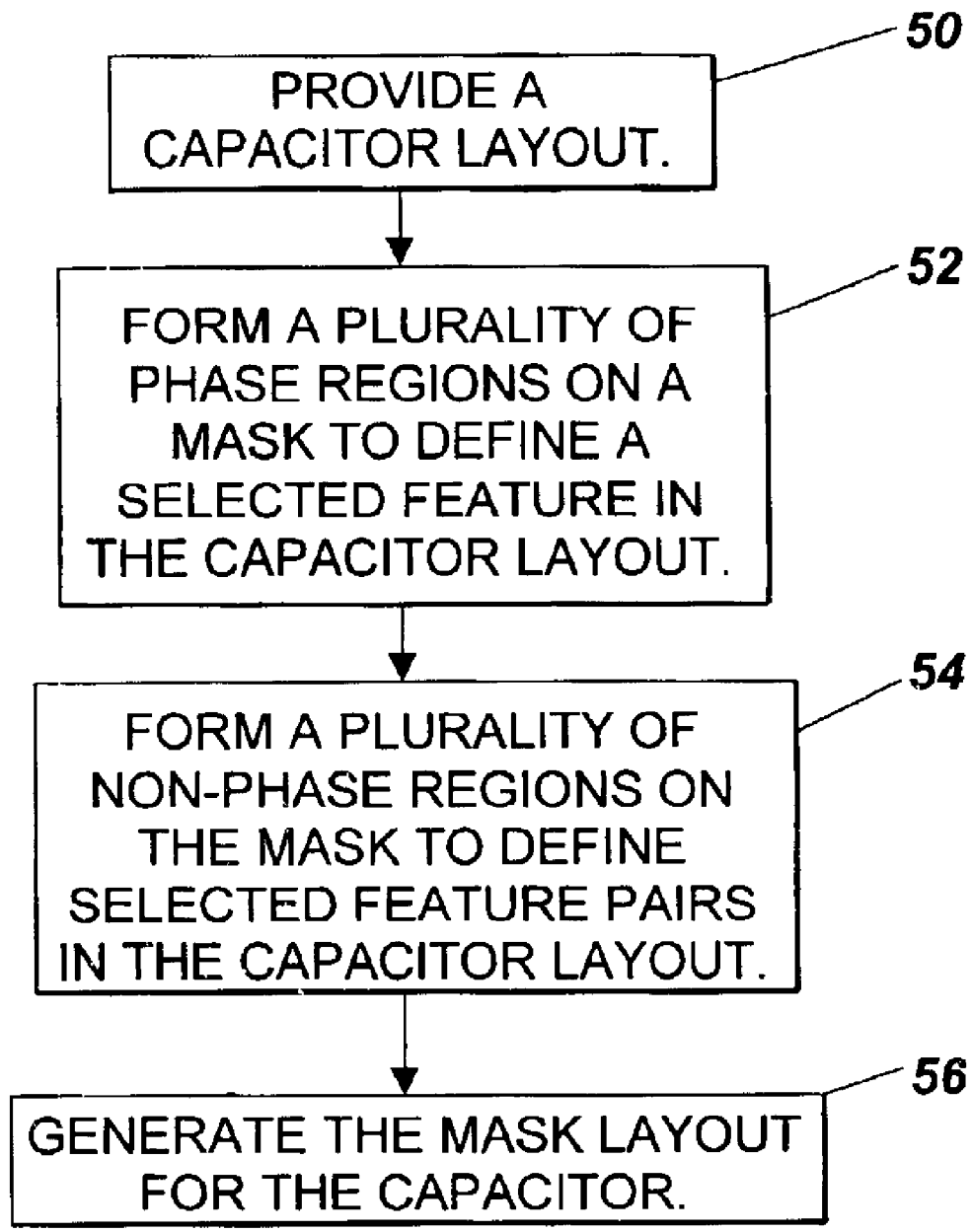
FIG. 4 illustrates the steps taken to generate a mask for fabrication of a capacitor in accordance with the teachings of the present invention.

FIG. 4 illustrates steps taken to generate a mask for a capacitor fabricated using altPSM lithography. To begin the generation of the mask, a capacitor layout is provided that illustrates the features of the capacitor (step 50). From the provided capacitor layout, a plurality of phase regions are defined to form a selected feature in the capacitor layout (step 52). Specifically, the phase regions are defined to avoid phase conflict in the altPSM lithography process. To avoid phase conflict in the capacitor layout provided, the phase regions are defined at the corner regions of the layout. As a result of defining the phase regions in the corner regions of the layout, a gate region of the capacitor has a closed plane figure bounded by straight lines so that the gate region resembles a cross like shape. The cross like shape is a result of a first plane region and a second plane region that intersect to form a quadrangular shaped region having four branches mutually at substantially right angles.

To pattern the corner regions of the capacitor, a plurality of non-phase mask regions, or trim mask regions, are defined to selectively delete the larger corner regions once the gate region is well defined by the multiple phase shift mask regions in the capacitor layout (step 54). Upon the identification of the phase shift mask regions and the non-phase mask regions a mask is generated for the capacitor layout provided (step 56).

While the present invention has been described with reference to a preferred embodiment thereof, one skilled in the art will appreciate that various changes in form and detail may be made without departing from the intended scope of the present invention as defined in the pending claims. For example, the capacitor formed from one of the capacitor layouts described above can be an N-channel MOS capacitor or can be a P-channel MOS capacitor.

What is claimed is:

1. A capacitor comprising:
a plurality of layers that are formed by one or more phase shift masks (PSM), the one or more PSMs enable formation of a first feature pair intersected by a first diagonal plane extending along an axis of the capacitor that intersects diagonally opposing first and second vertices of the capacitor and the one or more PSMs enable formation of a second feature pair intersected by a second diagonal plane extending along a second axis of the capacitor that intersects diagonally opposing third and fourth vertices of the capacitor.

2. The capacitor of claim 1, further comprising a polysilicon layer forming a gate region of the capacitor, the polysilicon layer covering a central portion of the capacitor and extending from the central portion of the capacitor to a plurality of edge portions of the capacitor, the plurality of edge portions of the capacitor defined in part by the formation of said first and second feature pairs.

3. The capacitor of claim 2, further comprising a first metalized contact formed over a portion of a first surface of said polysilicon layer.

4. The capacitor of claim 3, wherein the first metalized contact is located about a central portion of the polysilicon layer at about an intersection of the first diagonal plane and the second diagonal plane.

5. The capacitor of claim 3, further comprising a second metalized contact formed over a second portion of said first surface of said polysilicon layer.

6. The capacitor of claim 5, wherein said first and second metalized contacts are located in a common plane that extends from a first edge portion to a second edge portion of said plurality of edge portions.

7. The capacitor of claim 3, wherein said metalized contact is suitable for coupling the capacitor to a power source supplying a positive voltage.

8. The capacitor of claim 1, wherein a first feature of said first feature pair and a first feature of said second feature pair form a drain region for the capacitor.

9. The capacitor of claim 1, wherein a second feature of said first feature pair and a second feature of said second feature pair form a source region for the capacitor.

10. The capacitor of claim 1, wherein the capacitor further comprises a first metalized layer formed over a portion of a first surface of a first region in each of the first and second feature pairs and a second metalized layer formed over a portion of a first surface of a second region in each of the first and second feature pairs.

11. The capacitor layout for the capacitor of claim 1.

12. An array of capacitors, each capacitor in said array having a polygon shape, said array comprising;
a plurality of layers formed by one or more phase shift masks (PSM), the one or more PSMs enable formation of a first plurality of features for said array of capacitors, each of said first plurality of features having a shape to permit formation of a second plurality of features for said array of capacitors at each corner of each capacitor in said array of capacitors.

13. The array of capacitors of claim 12, wherein said first plurality of features and said second plurality of features are formed without phase conflict.

14. The array of capacitors of claim 12, wherein said second plurality of features comprise one or more source regions and one or more drain regions for each of said capacitors in said array of capacitors.

15. The array of capacitors of claim 12, wherein said first and second plurality of features comprises, a plurality of gate regions, each of said plurality of gate regions having a quadrangular shape region having four branches mutually at substantially right angles.

16. The layout for the array of capacitors of claim 12.

* * * * *